United States Patent
Takagi

(10) Patent No.: US 7,385,415 B2
(45) Date of Patent: Jun. 10, 2008

(54) SEMICONDUCTOR INTEGRATED CIRCUIT

(75) Inventor: Shingo Takagi, Kawasaki (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 11/627,650

(22) Filed: Jan. 26, 2007

(65) Prior Publication Data
US 2007/0176628 A1 Aug. 2, 2007

(30) Foreign Application Priority Data
Jan. 27, 2006 (JP) ............................. 2006-018955

(51) Int. Cl.
*H03K 17/16* (2006.01)
(52) U.S. Cl. ...................... 326/30; 326/21; 326/32; 326/33
(58) Field of Classification Search .................. 326/30, 326/32–34
See application file for complete search history.

(56) References Cited

U.S. PATENT DOCUMENTS

| | | | |
|---|---|---|---|
| 6,288,564 B1 * | 9/2001 | Hedberg | 326/30 |
| 7,064,575 B2 * | 6/2006 | Lou | 326/30 |
| 7,295,033 B2 * | 11/2007 | Chung et al. | 326/30 |
| 2004/0207451 A1 | 10/2004 | Kitagawa et al. | |

* cited by examiner

*Primary Examiner*—Anh Q. Tran
(74) *Attorney, Agent, or Firm*—Banner & Witcoff, Ltd

(57) ABSTRACT

A semiconductor integrated circuit for matching the resistance of a variable resistor, which is used as a terminating resistor or a reference of said terminating resistor, to the characteristic impedance of a transmission line, has a terminating resistor adjusting circuit that has a current circuit connected to a power supply, said variable resistor that is connected between said current circuit and the ground and receives a main current output from said current circuit, a comparator circuit that compares the potential of the variable resistor with a first reference potential and outputs a signal, and a control circuit that controls the resistance of said variable resistor based on the output signal of said comparator circuit; and an additional current adjusting circuit that is connected between said power supply and said variable resistor and outputs an additional current to said variable resistor according to an external signal determined by the resistance of an external parasitic resistor between said terminating resistor and said transmission line.

20 Claims, 3 Drawing Sheets

SEMICONDUCTOR INTEGRATED CIRCUIT

CROSS-REFERENCE TO RELATED APPLICATIONS

This application is based upon and claims the benefit of priority from the prior Japanese Patent Application No. 2006-18955, filed on Jan. 27, 2006, the entire contents of which are incorporated herein by reference.

BACKGROUND OF THE INVENTION

1. Field of the Invention

The present invention relates to a semiconductor integrated circuit that matches the resistance of a variable resistor, which is used as a terminating resistor or as a reference of the terminating resistor, to the characteristic impedance of a transmission line.

2. Background Art

Conventionally, in order to maintain the quality of the waveform of signals in the high-speed signal transmission at frequencies of several hundreds of MHz or higher, for example, it is highly important to precisely control the resistance of a terminating resistor to provide impedance matching to a transmission line.

However, the resistance of the terminating resistor varies with the semiconductor manufacturing process, the type of the power supply, and the temperature, for example. Thus, to control the resistance of the terminating resistor with precision to ±5% to ±10%, for example, the semiconductor integrated circuit has to have a terminating resistor adjusting circuit for accommodating the variations in resistance of the terminating resistor caused by the factors described above.

As an example, a conventional semiconductor integrated circuit has a terminating resistor adjusting circuit that includes a current circuit connected to a power supply, a variable resistor connected between the current circuit and the ground to receive a main current output from the current circuit, a comparator circuit that compares the potential of the variable resistor with a first reference potential and outputs a signal, and a control circuit that controls the resistance of the variable resistor based on the output signal of the comparator circuit (see Japanese Patent Laid-Open No. 2004-336699).

In this way, the conventional semiconductor integrated circuit described above controls the resistance of the terminating resistor taking into account variations in factors relating to the silicon substrate itself on which the semiconductor integrated circuit is formed (the manufacturing process, the power supply and the temperature, for example).

Even if the resistance of the terminating resistor is precisely adjusted taking into account variations in factors relating to the silicon substrate itself, external parasitic resistances due to components external to the silicon substrate including the test element group (TEG), the package, which varies with the product, the printed circuit board (PCB), that is, external parasitic resistances existing between the terminating resistor and the transmission line are actually added to the adjusted resistance of the terminating resistor when the product is completed.

However, the semiconductor integrated circuit has no mechanism to accommodate the variations in resistance due to the external parasitic resistances.

Therefore, the conventional semiconductor integrated circuit described above has a problem that the adjustment capability of the terminating resistor adjusting circuit has to be adjusted for each TEG or product because of the offset from the characteristic impedance of the transmission line due to the external parasitic resistances.

SUMMARY OF THE INVENTION

According one aspect of the present invention, there is provided: a semiconductor integrated circuit for matching the resistance of a variable resistor, which is used as a terminating resistor or a reference of said terminating resistor, to the characteristic impedance of a transmission line, comprising a terminating resistor adjusting circuit that has a current circuit connected to a power supply, said variable resistor that is connected between said current circuit and the ground and receives a main current output from said current circuit, a comparator circuit that compares the potential of the variable resistor with a first reference potential and outputs a signal, and a control circuit that controls the resistance of said variable resistor based on the output signal of said comparator circuit; and an additional current adjusting circuit that is connected between said power supply and said variable resistor and outputs an additional current to said variable resistor according to an external signal determined by the resistance of an external parasitic resistor between said terminating resistor and said transmission line.

According further aspect of the present invention, there is provided: a semiconductor integrated circuit for matching the resistance of a variable resistor, which is used as a reference of a terminating resistor, to the characteristic impedance of a transmission line, comprising a terminating resistor adjusting circuit that has a current circuit connected to a power supply, said variable resistor that is connected between said current circuit and the ground and receives a main current output from said current circuit, a comparator circuit that compares the potential of the variable resistor with a first reference potential and outputs a signal, and a control circuit that controls the resistance of said variable resistor based on the output signal of said comparator circuit; and an additional current adjusting circuit that is connected between said power supply and said variable resistor and outputs an additional current to said variable resistor according to an external signal determined by the resistance of an external parasitic resistor between said terminating resistor and said transmission line.

According the other aspect of the present invention, there is provided: a transmission system, comprising a transmission line; a terminating resistor to be impedance-matched to said transmission line; and a semiconductor integrated circuit for matching the resistance of a variable resistor, which is used as a terminating resistor or a reference of said terminating resistor, to the characteristic impedance of a transmission line, comprising a terminating resistor adjusting circuit that has a current circuit connected to a power supply, said variable resistor that is connected between said current circuit and the ground and receives a main current output from said current circuit, a comparator circuit that compares the potential of the variable resistor with a first reference potential and outputs a signal, and a control circuit that controls the resistance of said variable resistor based on the output signal of said comparator circuit; and an additional current adjusting circuit that is connected between said power supply and said variable resistor and outputs an additional current to said variable resistor according to an external signal determined by the resistance of an external parasitic resistor between said terminating resistor and said transmission line.

DETAILED DESCRIPTION

As described above, in order to maintain the quality of the waveform of signals in the high-speed signal transmission at frequencies of several hundreds of MHz or higher, for example, it is highly important to precisely control the resistance of a terminating resistor to provide impedance matching to a transmission line.

Thus, a semiconductor integrated circuit according to an aspect of the present invention has a terminating resistance adjusting circuit for accommodating variations in resistance of the terminating resistor due to factors relating to the silicon substrate itself on which the semiconductor integrated circuit is formed (the manufacturing process, the power supply and the temperature, for example) and variations in resistance due to external parasitic resistances due to components external to the silicon substrate including a package and a PCB.

More specifically, the semiconductor integrated circuit according to an aspect of the present invention cancels the difference (offset) of the resistance of the terminating resistor from the characteristic impedance of the transmission line due to external parasitic resistances added to the resistance of the terminating resistor by programmably adjusting the resistance of the terminating resistor based on an input external signal determined by the external parasitic resistances.

In the following, embodiments of the present invention will be described with reference to the drawings.

Embodiment 1

With regard to this embodiment 1, there will be described a semiconductor integrated circuit for matching the resistance of a variable resistor, which is used as a terminating resistor or a reference of the terminating resistor, to the characteristic impedance of a transmission line.

Figure 1:
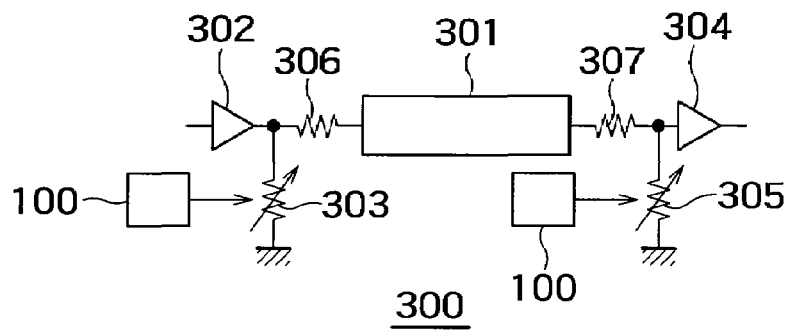
FIG. 1 is a diagram showing a transmission system in which the semiconductor integrated circuit according to the embodiment 1 of the present invention, which is an aspect of the present invention, is used.

FIG. 1 is a diagram showing a transmission system in which the semiconductor integrated circuit according to the embodiment 1 of the present invention, which is an aspect of the present invention, is used.

As shown in FIG. 1, a transmission system 300 has a semiconductor integrated circuit 100, a transmission line 301, a transmitter-side device 302, a terminating resistor 303 to be impedance-matched on the transmitter-side device 302, a receiver-side device 304, and a terminating resistor 305 to be impedance-matched on the receiver-side device 304.

As described above, there are parasitic resistors 306 and 307 external to the silicon substrate, such as of an actual TEG, a package, which varies with the product, and a PCB, between the transmission line 301 and the terminating resistor 303 and between the transmission line 301 and the terminating resistor 305, respectively.

Thus, as described above, the semiconductor integrated circuit 100 according to this embodiment carries out predefined adjustment operations for the terminating resistor 303 on the transmitter side and the terminating resistor 305 on the receiver side.

Specifically, the semiconductor integrated circuit 100 cancels the differences (offsets) of the resistances of the terminating resistors 303 and 305 from the characteristic impedance of the transmission line 301 due to the resistances of the external parasitic resistors 306 and 307 added to the resistances of the terminating resistors 303 and 305, respectively, by programmably adjusting the resistances of the terminating resistors 303 and 305 based on an input external signal determined by the resistances of the external parasitic resistors 306 and 307.

Although the terminating resistors 303 and 305 are shown as components separate from the semiconductor integrated circuit 100 in FIG. 1, the terminating resistors 303 and 305 may be incorporated in the semiconductor integrated circuit 100.

Furthermore, although the semiconductor integrated circuit 100 is shown as a component separate from the transmitter-side device 302 and the receiver-side device 304 in FIG. 1, the transmitter-side device 302 and the receivers-side device 304 may incorporate their respective semiconductor integrated circuits 100.

Figure 2:
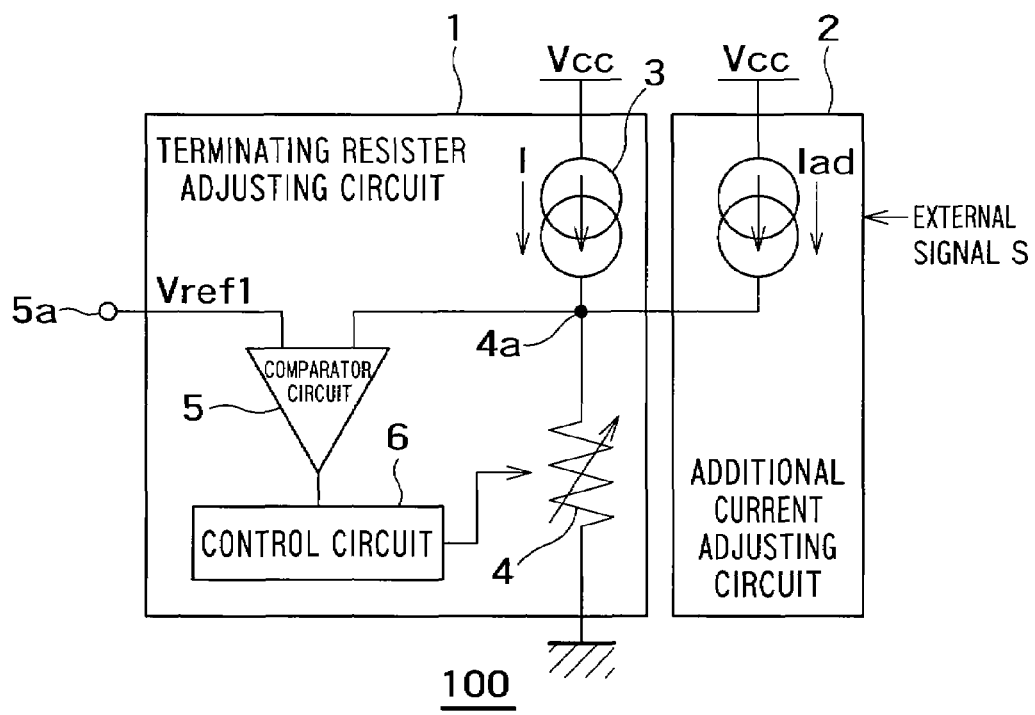
FIG. 2 is a circuit diagram showing essential parts of the semiconductor integrated circuit according to the embodiment 1, which is an aspect of the present invention.

FIG. 2 is a circuit diagram showing essential parts of the semiconductor integrated circuit according to the embodiment 1, which is an aspect of the present invention.

As shown in FIG. 2, the semiconductor integrated circuit 100 has a terminating resistor adjusting circuit 1 for adjusting the resistance of the terminating resistor and an additional current adjusting circuit 2 for supplying an additional current for adjusting the resistance of the terminating resistor to the terminating resistor adjusting circuit 1 based on an input external signal "S" (or in other words, adding an arbitrary offset based on the external parasitic resistances).

The terminating resistor adjusting circuit 1 has a current circuit 3 that is connected to a power supply "Vcc" and outputs a main current "I", a variable resistor 4 that is connected between the current circuit 3 and the ground and receives the main current, a comparator circuit 5 that compares the potential at one terminal 4a of the variable resistor 4 with a first reference potential "Vref1" and outputs a signal, and a control circuit 6 that controls the resistance of the variable resistor 4 based on the output signal of the comparator circuit 5.

The additional current adjusting circuit 2 is connected between the power supply "Vcc" and the variable resistor 4. The additional current adjusting circuit 2 outputs an additional current "Iad" kept at a desired value based on an external signal to the variable resistor 4.

The main current "I" output from the current circuit 3 and the reference potential "Vref1" are adjusted based on the value of the characteristic impedance of the transmission line used in the transmission system.

To provide matching to the characteristic impedance of the transmission line, the resistance of the variable resistor 4 is set at 50Ω or 70Ω, for example.

Figure 3:
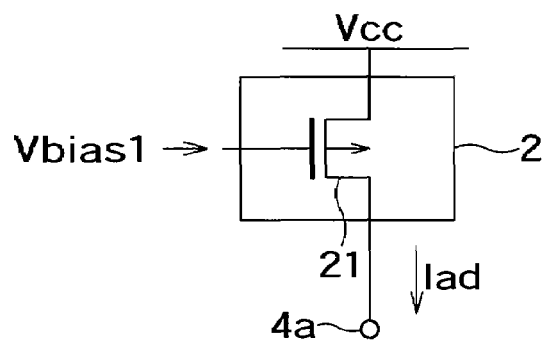
FIG. 3 shows a configuration of essential parts of the additional current adjusting circuit.

FIG. 3 shows a configuration of essential parts of the additional current adjusting circuit 2.

As shown in FIG. 3, the additional current adjusting circuit 2 has a p-type MOS transistor 21, the source thereof being connected to the power supply "Vcc", the drain thereof being connected to the terminal 4a of the variable resistor 4, and a bias voltage "Vbias1" determined by the external signal "S" being applied to the gate thereof. The p-type MOS transistor 21 controls the additional current "Iad" according to the bias voltage "Vbias".

Figure 4:
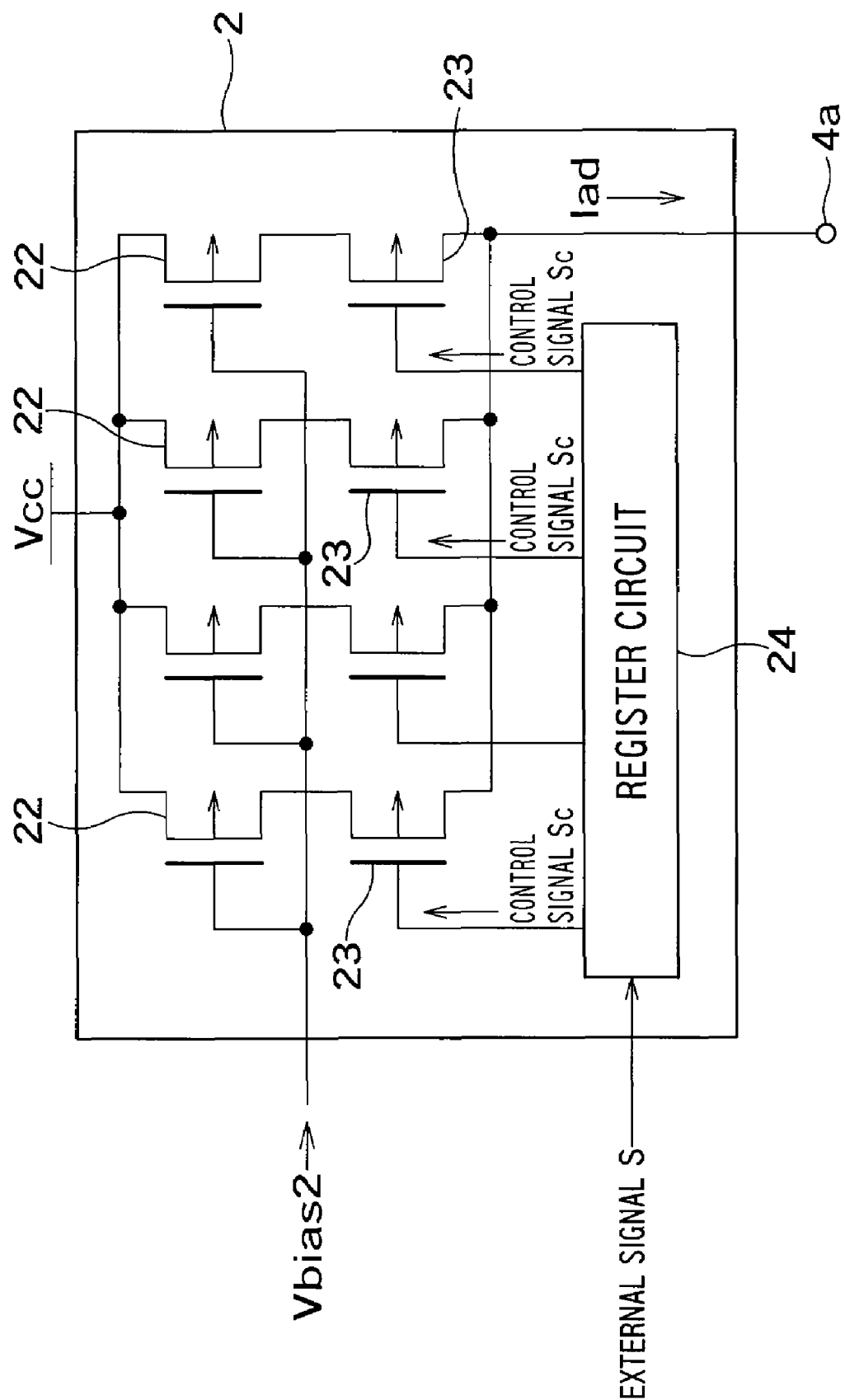
FIG. 4 shows another configuration of essential parts of the additional current adjusting circuit.

FIG. 4 shows another configuration of essential parts of the additional current adjusting circuit 2.

As shown in FIG. 4, the additional current adjusting circuit 2 has a plurality of p-type MOS transistors 22 that output the additional current "Iad" according to a bias voltage "Vbias2" applied to the gates thereof, a plurality of p-type MOS transistors 23 that are connected between the power supply "Vcc" and the terminal 4a of the variable resistor 4 in series with their respective corresponding p-type MOS transistors 22 and serve as switching elements, and a register circuit 24 that outputs a control signal "Sc" to the gates of the p-type MOS transistors 23 based on the input external signal "S" to control the p-type MOS transistors 23.

The p-type MOS transistors 22 output respective currents according to the bias voltage "Vbias2" applied to the respective gates.

As described above, the register circuit 24 outputs the control signal "Sc" to the gates of the p-type MOS transistors 23 serving as switching elements according to the input external signal "S", thereby turning on or off the p-type MOS transistors 23, thereby making a selection from the currents output from the p-type MOS transistors 22. The sum of the selected currents is output to the terminal 4a as the desired additional current "Iad".

As described above, the additional current adjusting circuit 2 can be implemented by a simple circuit configuration.

Although the configurations described above with reference to FIGS. 3 and 4 use p-type MOS transistors, n-type MOS transistors or bipolar transistors may be used as required.

The external signal "S" is programmably determined by the resistance of the external parasitic resistor between the terminating resistor and the transmission line.

The external signal "S" may not be directly input to the additional current adjusting circuit 2. For example, the external signal "S" may be input to a memory circuit (not shown) in the semiconductor integrated circuit 100, and a control signal (bias voltage) determined according to information stored in the memory circuit may be input to the additional current adjusting circuit 2 to control the additional current "Iad".

Furthermore, the resistance of the external parasitic resistor may be determined by simulation during the step of designing the product (transmission system) including the semiconductor integrated circuit 100. Alternatively, the resistance of the external parasitic resistor may be determined with an external test circuit (not shown) after the product (transmission system) is completed.

In the following, an operation of the semiconductor integrated circuit 100 configured as described above will be described.

When the additional current adjusting circuit 2 receives the external signal "S" determined according to the resistance of the external parasitic resistor, the additional current adjusting circuit 2 adds a desired constant additional current "Iad" to the main current "I".

Since the sum of the additional current "Iad" and the main current "I" flows through the variable resistor 4, the potential at the terminal 4a increases.

Then, the comparator circuit 5 compares the potential at the terminal 4a with the reference potential "Vref1" and outputs a signal indicative of the result of the comparison to the control circuit 6.

Based on the signal, the control circuit 6 controls and lowers the resistance of the variable resistor 4 to make the potential at the terminal 4a equal to the reference potential "Vref1".

Through the operation described above, the resistance of the variable resistor 4 can be lowered to the desired value by adding the desired additional current "Iad" to the main current "I". Thus, the resistance of the variable resistor 4, which is used as the terminating resistor or as a reference of the terminating resistor, once adjusted by the terminating resistor adjusting circuit 1 can be lowered by an amount equal to the offset due to the external parasitic resistors.

As a result, the sum of the adjusted resistance of the variable resistor 4 and the resistances of the external parasitic resistors matches to the characteristic impedance.

As described above, the semiconductor integrated circuit according to this embodiment can externally programmably adjust the offset of the resistance of the terminating resistor according to the resistances of the external parasitic resistors to provide precise impedance matching.

In addition, since the resistance of the terminating resistor can be externally adjusted after the terminating resistor adjusting circuit is formed on the silicon substrate, the number of experimental productions for adjustment of the resistance of the terminating resistor and the cost of the product can be reduced.

Embodiment 2

With regard to the embodiment 1, configurations of the additional current adjusting circuit in the semiconductor integrated circuit have been described in detail. With regard to this embodiment 2, a configuration of a current circuit in a semiconductor integrated circuit will be described specifically. The semiconductor integrated circuit according to this embodiment can be equally applied to the transmission system shown in FIG. 1.

Figure 5:
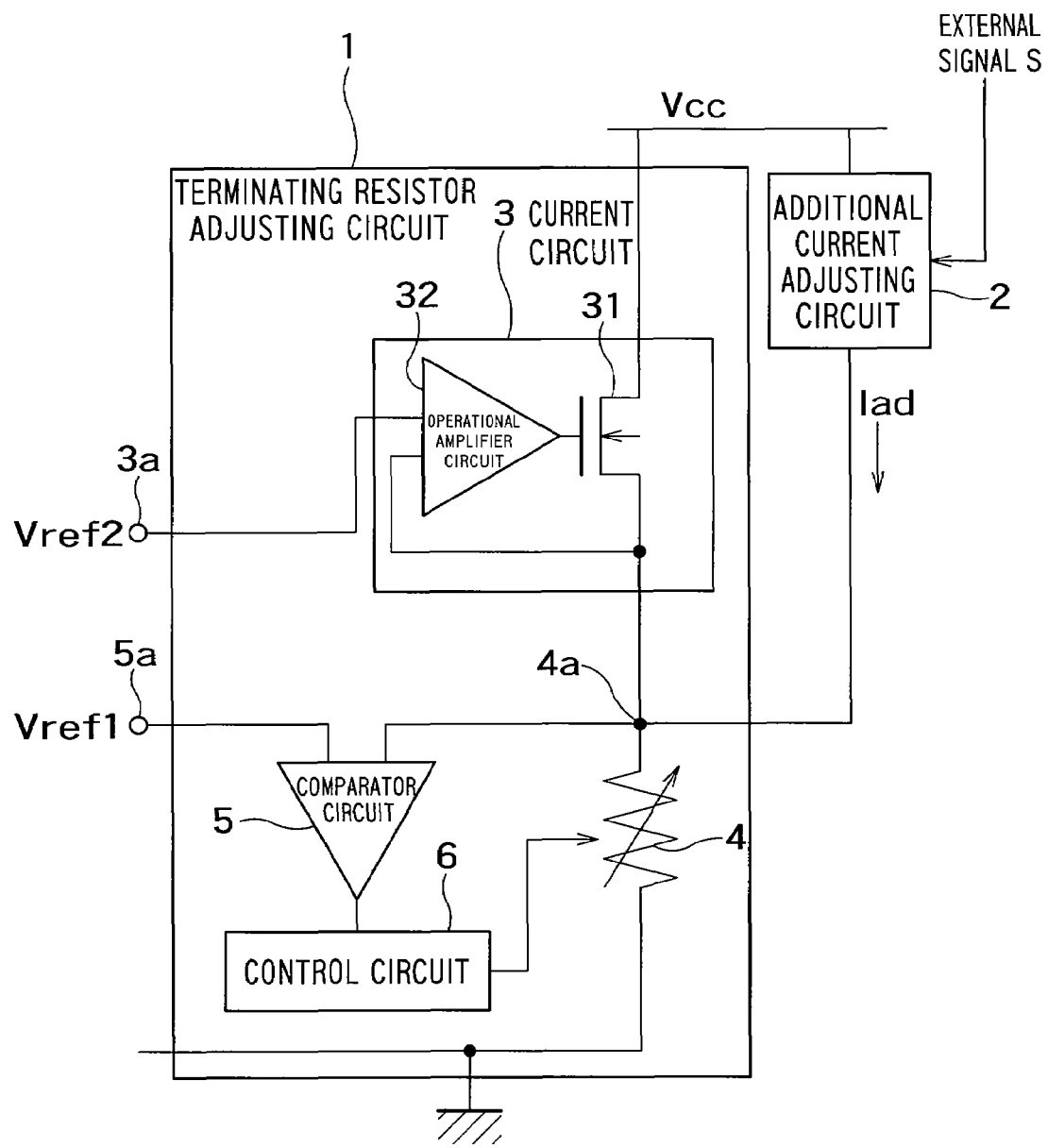
FIG. 5 is a circuit diagram showing a configuration of essential parts of a semiconductor integrated circuit according to the embodiment 2, which is an aspect of the present invention.

FIG. 5 is a circuit diagram showing a configuration of essential parts of a semiconductor integrated circuit 200 according to the embodiment 2, which is an aspect of the present invention. In this drawing, the same reference numerals as those in the embodiment 1 denote the same elements in the embodiment 1.

As shown in FIG. 5, a current circuit 3 has an n-type MOS transistor 31 that has the drain connected to a power supply "Vcc" and the source connected to a variable resistor 4 and outputs a main current "I", and an operational amplifier circuit 32 that receives the potential between the n-type MOS transistor 31 and the variable resistor 4 (the potential at a terminal 4a in this example) and a second reference potential "Vref2" from a terminal 3a and outputs a signal to the gate of the n-type MOS transistor 31.

The current circuit 3 can output a desired main current "I" by adjusting the second reference potential "Vref2" applied to the terminal 3a.

As in the embodiment 1, the main current "I" output from the current circuit 3 and the reference potential "Vref1" are adjusted based on the value of the characteristic impedance of the transmission line used in the transmission system.

In addition, although the configuration described above with reference to FIG. 5 uses the n-type MOS transistor, a p-type MOS transistor or a bipolar transistor may be used as required.

The semiconductor integrated circuit 200 configured as described above operates in the same manner as the semiconductor integrated circuit according to the embodiment 1.

As described above, as in the embodiment 1, the semiconductor integrated circuit according to this embodiment can externally programmably adjust the offset of the resistance of the terminating resistor according to the resistances of the external parasitic resistors to provide precise impedance matching.

What is claimed is:

1. A semiconductor integrated circuit for matching the resistance of a variable resistor, which is used as a terminating resistor or a reference of said terminating resistor, to the characteristic impedance of a transmission line, comprising:
    a terminating resistor adjusting circuit that has a current circuit connected to a power supply, said variable resistor that is connected between said current circuit and the ground and receives a main current output from said current circuit, a comparator circuit that compares the potential of the variable resistor with a first reference potential and outputs a signal, and a control circuit that controls the resistance of said variable resistor based on the output signal of said comparator circuit; and
    an additional current adjusting circuit that is connected between said power supply and said variable resistor and outputs an additional current to said variable resistor according to an external signal determined by the resistance of an external parasitic resistor between said terminating resistor and said transmission line.

2. The semiconductor integrated circuit according to claim 1, wherein said additional current adjusting circuit has a MOS transistor connected between said power supply and said variable resistor, a bias voltage determined by said external signal being applied to the gate of the MOS transistor, and
    said MOS transistor outputs said additional current to said variable resistor according to said bias voltage.

3. The semiconductor integrated circuit according to claim 1, wherein said additional current adjusting circuit has a plurality of MOS transistors that output said additional current according to bias voltages applied to the gates thereof and a plurality of switching elements connected in series with said plurality of MOS transistors between said power supply and said variable resistor, and
    said switching elements are controlled based on said external signal.

4. The semiconductor integrated circuit according to claim 3, wherein said additional current adjusting circuit further has a register circuit that controls said switching elements based on said input external signal.

5. The semiconductor integrated circuit according to claim 1, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

6. The semiconductor integrated circuit according to claim 2, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

7. The semiconductor integrated circuit according to claim 3, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

8. The semiconductor integrated circuit according to claim 4, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

9. A semiconductor integrated circuit for matching the resistance of a variable resistor, which is used as a reference of a terminating resistor, to the characteristic impedance of a transmission line, comprising:
    a terminating resistor adjusting circuit that has a current circuit connected to a power supply, said variable resistor that is connected between said current circuit and the ground and receives a main current output from said current circuit, a comparator circuit that compares the potential of the variable resistor with a first reference potential and outputs a signal, and a control circuit that controls the resistance of said variable resistor based on the output signal of said comparator circuit; and
    an additional current adjusting circuit that is connected between said power supply and said variable resistor and outputs an additional current to said variable resistor according to an external signal determined by the resistance of an external parasitic resistor between said terminating resistor and said transmission line.

10. The semiconductor integrated circuit according to claim 9, wherein said additional current adjusting circuit has a MOS transistor connected between said power supply and said variable resistor, a bias voltage determined by said external signal being applied to the gate of the MOS transistor, and
    said MOS transistor outputs said additional current to said variable resistor according to said bias voltage.

11. The semiconductor integrated circuit according to claim 9, wherein said additional current adjusting circuit has a plurality of MOS transistors that output said additional current according to bias voltages applied to the gates thereof and a plurality of switching elements connected in series with said plurality of MOS transistors between said power supply and said variable resistor, and
    said switching elements are controlled based on said external signal.

12. The semiconductor integrated circuit according to claim 9, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

13. A transmission system, comprising:
a transmission line;
a terminating resistor to be impedance-matched to said transmission line; and
a semiconductor integrated circuit for matching the resistance of a variable resistor, which is used as a terminating resistor or a reference of said terminating resistor, to the characteristic impedance of a transmission line, comprising a terminating resistor adjusting circuit that has a current circuit connected to a power supply, said variable resistor that is connected between said current circuit and the ground and receives a main current output from said current circuit, a comparator circuit that compares the potential of the variable resistor with a first reference potential and outputs a signal, and a control circuit that controls the resistance of said variable resistor based on the output signal of said comparator circuit; and an additional current adjusting circuit that is connected between said power supply and said variable resistor and outputs an additional current to said variable resistor according to an external signal determined by the resistance of an external parasitic resistor between said terminating resistor and said transmission line.

14. The transmission system according to claim 13, wherein said additional current adjusting circuit has a MOS transistor connected between said power supply and said variable resistor, a bias voltage determined by said external signal being applied to the gate of the MOS transistor, and said MOS transistor outputs said additional current to said variable resistor according to said bias voltage.

15. The transmission system according to claim 13, wherein said additional current adjusting circuit has a plurality of MOS transistors that output said additional current according to bias voltages applied to the gates thereof and a plurality of switching elements connected in series with said plurality of MOS transistors between said power supply and said variable resistor, and said switching elements are controlled based on said external signal.

16. The transmission system according to claim 15, wherein said additional current adjusting circuit further has a register circuit that controls said switching elements based on said input external signal.

17. The transmission system according to claim 13, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

18. The transmission system according to claim 14, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

19. The transmission system according to claim 15, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

20. The transmission system according to claim 16, wherein said current circuit has a MOS transistor that is connected between said power supply and said variable resistor and outputs said main current, and an operational amplifier that receives the potential between said MOS transistor and said variable resistor and a second reference potential and outputs a signal to the gate of said MOS transistor.

* * * * *